United States Patent [19]
Chen

[11] Patent Number: 6,141,252
[45] Date of Patent: Oct. 31, 2000

[54] VOLTAGE REGULATION FOR INTEGRATED CIRCUIT MEMORY

[75] Inventor: Chun Chen, Emmaus, Pa.

[73] Assignee: Lucent Technologies Inc., Murray Hill, N.J.

[21] Appl. No.: 09/352,566

[22] Filed: Jul. 13, 1999

[51] Int. Cl.[7] .................................................. G11C 11/34
[52] U.S. Cl. ................................ 365/185.18; 365/185.23
[58] Field of Search ........................ 365/185.23, 185.24, 365/185.18

[56] References Cited

U.S. PATENT DOCUMENTS 5,077,691  12/1991  Haddad et al. ..................... 365/185.23

*Primary Examiner*—David Nelms
*Assistant Examiner*—M. Tran
*Attorney, Agent, or Firm*—James H. Fox; John P. Veschi

[57] ABSTRACT

An integrated circuit has an improved voltage regulator for use with memory devices that utilize secondary electron injection for programming. The memory device, typically a floating-gate EEPROM, has source and drain regions formed in a doped tub region. A first voltage source is used to reverse-bias a diode, formed in the same process as the source and drain regions of the memory device, to near the breakdown voltage. A small bias current flows through the reverse-biased diode from the first voltage source to a second voltage source, thereby establishing a reference voltage. The drain voltage of the memory device is then biased, typically by a bipolar transistor, to about a diode drop (about 0.7V) below the reference voltage, and hence correspondingly below the drain-to-tub breakdown voltage of the memory device. In this manner, the reference voltage tracks changes in the memory device due to process variations, temperature variations, etc., so that improved programming speed and/or disturb margins are obtained.

21 Claims, 1 Drawing Sheet

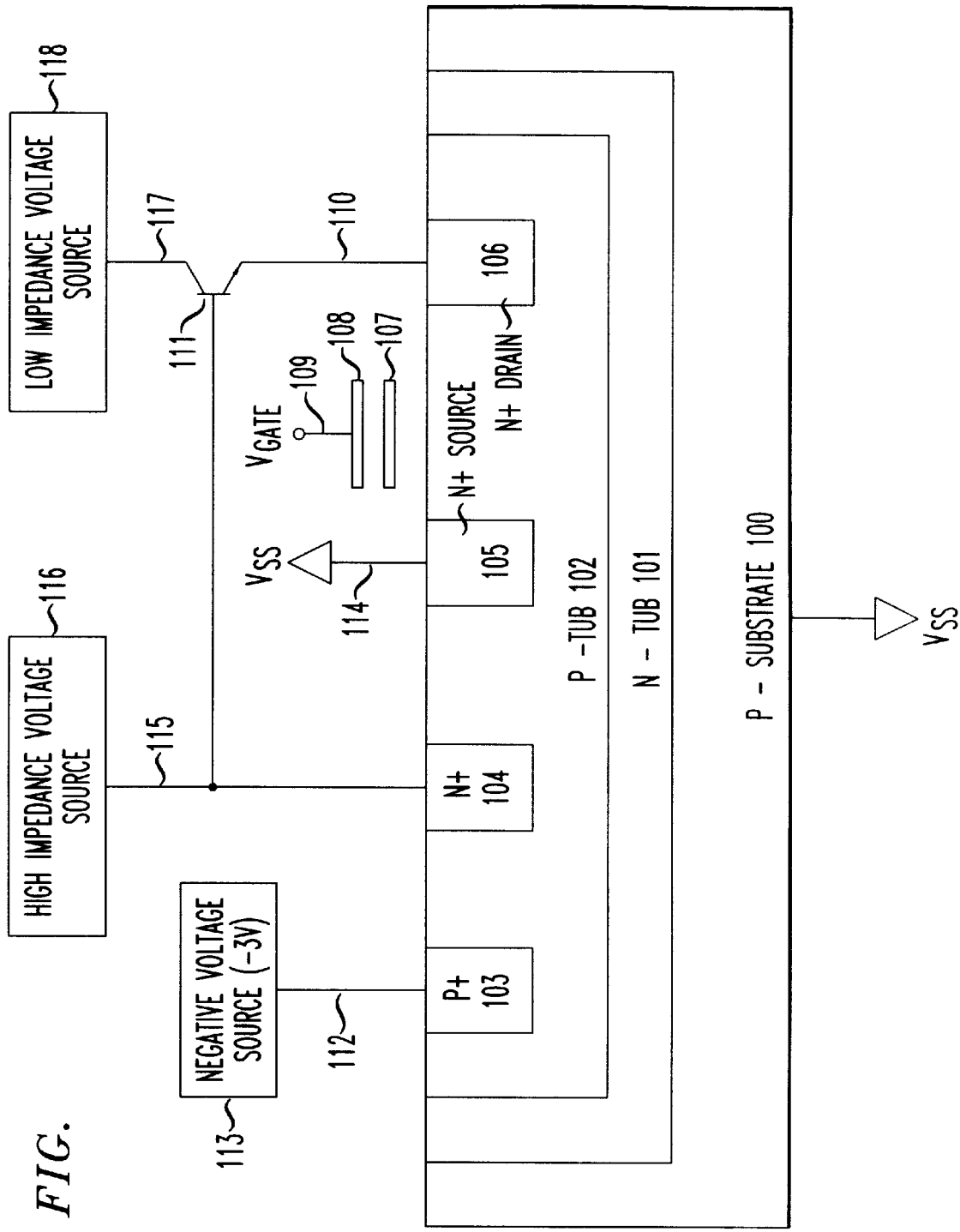

VOLTAGE REGULATION FOR INTEGRATED CIRCUIT MEMORY

BACKGROUND OF THE INVENTION

1. Field of the Invention

The present invention relates to an integrated circuit (IC) having a voltage regulator used with a memory.

2. Description of the Related Art

Non-volatile memory is used in applications where it is desired to retain the information stored in the memory even if power is not applied. Various types of integrated circuit technologies have been devised to implement non-volatile memory, with the electrically erasable programmable read-only memory (EEPROM) being of significant commercial interest. EEPROMs rely on charge injection to a charge storage region, typically a floating (e.g., insulated) gate for storing the charge that determines whether a logic "1" or "0" is stored in the case of a binary memory. However, more than two levels of stored charge are possible for multi-level memory cells that store more than two logic levels. A particular form of EEPROM, referred to as "flash" memory, allows for erasing an entire memory array or sub-array. This is a much faster operation than if each memory cell in the array were erased independently.

To program the EEPROM cell, a high voltage of a given polarity with respect to the tub is applied to the drain junction, in order to inject charge to the floating gate. Regulating the programming voltage by a zener diode formed concurrently in a flash memory process has been used for conventional channel hot electron injection, such as described in U.S. Pat. No. 5,103,425. To erase the cell, a high voltage of the opposite polarity is applied to the gate in order to remove the stored charge. The write/erase programming operation in an EEPROM cell is typically much slower than a read operation that retrieves information from the cell, and so efforts have been made to maximize the programming speed.

One form of floating-gate memory suitable for implementing a flash memory array utilizes secondary electron injection to assist in programming a memory cell. This technique allows for the use of a lower voltage for programming the cell as described in U.S. Pat. No. 5,659,504 "Method and Apparatus for Hot Carrier Injection", co-assigned herewith, and which is incorporated herein by reference. In order to generate sufficient number of secondary electrons, the drain-to-tub junction of an EEPROM cell is reverse biased into the sub-breakdown regime, which is about 0.5V–1.0V below the real breakdown voltage. The closer the junction is biased to breakdown, the faster the programming, but the less the margin of program disturb. To program a positive logic "1" into the cell in one present-day implementation, approximately −3 volts is applied to the tub in which the memory cells are located, and about+3 volts is applied to the bit line, which is connected to the drains of the memory cells. In order to erase the cell (i.e., write a positive logic "0"), the memory tub is typically biased to about +10 volts and the gate to about −8 volts, both with respect to the wafer substrate at 0 volts. This removes the charge on the floating gate, being electrons in the case of an n-channel memory device. In this regime the programming speed and disturb margin of the flash memory device is very sensitive to supply voltage fluctuations and manufacturing process variations which could change the abruptness of the drain junction.

When reading the cell, about +1 volts are applied to the bit line, and 0 volts applied to the memory cell tub with respect to the wafer substrate. However, the drain-to-tub bias voltage is not applied during reading, since secondary electrons do not need to be generated.

SUMMARY OF THE INVENTION

I have invented an integrated circuit having a voltage regulator for use with memory devices formed in a doped tub region. A high impedance voltage source is used to reverse-bias a diode, advantageously formed in the same process as the source and drain regions of a memory device, to approximately the breakdown voltage. A bias current flows through the reverse-biased diode, thereby establishing a reference voltage across the diode. The drain of the memory device is then biased, typically by a bipolar transistor, to about a diode drop (about 0.7V) below the reference voltage, and hence approximately a diode drop below the drain-to-tub breakdown voltage of the memory device. In a typical embodiment, the memory device is a floating-gate memory device.

BRIEF DESCRIPTION OF THE DRAWINGS

The FIGURE shows an illustrative embodiment of the invention.

DETAILED DESCRIPTION

The following detailed description relates to a voltage regulation technique suitable for use with floating-gate type flash EEPROM memories, with other applications being possible. The regulation system for secondary electron injection type floating gate memories is more complex than for various other designs, since both negative and positive charge pumps need to be regulated. I have determined that more accurate regulation of drain voltage is desirable in order to both maximize programming speed and maintain an adequate disturb margin. Note that the "disturb margin" relates to the fact that the unselected cells on the same bit line experience the same drain-to-tub bias (6 volts in the illustrative case), which causes undesirable injection of electrons into the floating gate, referred to as "disturb".

In the present technique, a voltage source, typically a small reference pump with high output impedance, is used to induce the breakdown of a reverse-biased reference diode. The reference diode is desirably formed in the same IC fabrication process, and typically in the same tub, as the memory cell source and drain regions. This allows the reference diode to track changes in the memory cell, as may be due to process variations, voltage variations, temperature effects, etc. Due to the high impedance, a small bias current flows through the reference diode from the reference pump to a negative voltage source, typically also a charge pump. This small current minimizes the additional load on the negative pump, which is also typically used to bias the tub with respect to the semiconductor wafer substrate to about −3 volts in the illustrative embodiment. In practice, the impedance of the high-impedance voltage source is chosen so that the current through the reverse-biased reference diode is typically less than 100 microamps.

The drain voltage bias of flash memory devices is then regulated to about a diode voltage drop (about 0.7V) below the drain-to-substrate breakdown voltage. This is typically accomplished by a bipolar transistor, which is desirably formed in the same IC fabrication process as the flash memory. The collector of the bipolar transistor is connected to a low impedance voltage source, typically providing a current of greater than 1 milliamp to the memory cell during programming. The current gain of the bipolar transistor isolates the programming current from the reference diode. The inventive voltage regulation technique has the ability to track the process variations and the substrate bias fluctuations, and it consistently biases the junction between the drain and substrate of the memory device to about 0.7V below breakdown. I have determined that this provides for improved performance with respect to programming speed and/or disturb margins as compared to typical prior-art biasing techniques, with still other benefits being possible.

Referring to the FIGURE, an illustrative embodiment of the invention with a floating-gate memory cell of the "stacked gate" variety is shown. The stacked gate cell forms the floating gate 107 directly under the control gate 108, with the dielectric layers that overlie, separate and underlie these gates being omitted for clarity. Alternatively, split-gate designs, wherein the gates are partially offset, are also known in the art, and may be used. The memory cell is formed in p-tub 102 located in n-tub 101. Note that the term "well" is also used by workers in the art synonymously with "tub", and either refers to a doped semiconductor region. A tub may be formed in a substrate, or in another tub, typically of the opposite doping type. In addition, one type of tub (e.g., p-tub) may be formed within another type of tub (e.g., n-tub) formed in the substrate (e.g., p-type substrate). The memory cell is typically one of many in an array formed in the p-tub 102 and comprises n+ source region 105 connected via a conductor 114 to $V_{ss}$ (0 volts) in the illustrative case. The p-tub 102 is connected to a negative voltage source 113 by means of a p+ tub-tie region 103 and conductor 112. The negative voltage source 113 is typically a charge pump located on the same IC as the memory array, but could be an external voltage source if desired. Similarly, the high-impedance voltage source 116 and low impedance voltage source 118 are typically charge pumps, providing about 4 volts in a typical embodiment, but could be external sources.

The reverse-biased reference diode comprising n+ region 104 as the cathode and p-tub 102 as the anode is connected via conductor 115 to the high impedance voltage source 116. The n+ cathode 104 typically has the same doping and geometry as the drain junction 106 of the memory device so that it tracks the drain junction breakdown voltage of the memory device. However, the structure of the reference diode could be modified, as by changing the doping level or adding additional doped regions, if modified breakdown characteristics (e.g., zener or avalanche) are desired. In the illustrative case, the reference diode is biased between a separately regulated negative voltage Vsub (−3V) and a positive voltage generated by a small positive charge pump 116. With sufficient time, the positive voltage on the reverse breakdown reference diode will stabilize as:

Vref=Vbd+Vsub, where Vbd is the breakdown voltage of the drain junction inside a flash memory device, being about 7V on one current IC implementation. Vref is then used to control the gate bias of the bipolar or n-channel MOSFET device through which the output of the main charge pump is passed to drains of flash memory devices. In such case, the drain bias of the flash memory devices is regulated at:

Vd=Vref−0.7=Vbd+Vsub−0.7, which means the drain bias is always Vd−Vsub=Vbd−0.7V, regardless of the possible process variations which could change the exact values of Vbd or fluctuations in Vsub. While the present technique is advantageously used with floating-gate EEPROMs that utilize secondary electron injection for programming, applications to other types of non-volatile memory, including those that utilize secondary electron injection for programming is also possible, and included herein. Also, the illustrative embodiment has shown the use of a bipolar transistor as the voltage-dropping device, since it provides current gain that minimizes the current injected into the tub 102 from the voltage source 118, thereby minimizing disturbances to the memory cell from that source. In addition, the diode formed by the base-to-source junction provides a voltage drop of about 0.7 volts, which is about ideal for use with typical EEPROM cells. However, the use of a different voltage dropping device, for example a field effect transistor, is possible, if adequate consideration is given to minimize changes in the back-gate biasing so as to provide a relatively constant voltage drop in the range of about 0.5 to 0.8 volts below Vref. The reference diode is desirably formed in the same tub as the memory cell as shown in the FIGURE, whereby the anode is formed as part of the tub, and hence integrally connected thereto. However, the reference diode may be formed in a separate tub if desired, and the anode connected to the tub in which the memory cell is formed. In a typical embodiment, a single voltage regulator comprising a reference diode and bipolar transistor may be used for all of the memory cells in a given array in a given tub. However, more than one voltage regulator may be used if desired, as for preventing excessive current drain on a given bipolar transistor, or for other purposes. It is possible for several memory arrays to be formed on a given integrated circuit, each with its own voltage regulator if desired.

Note finally that while the above illustrative embodiment has been given in terms of a n-channel EEPROM cell, the use of a p-channel EEPROM cell is possible, in which case the doping conductivity types and voltage polarities will be reversed from those illustrated.

I claim:

1. An integrated circuit that includes a memory cell comprising source and drain regions formed in a doped tub, and a control gate overlying said tub;

characterized in that said integrated circuit further includes a voltage regulator comprising a reverse-breakdown diode having an anode connected to said doped tub, and a cathode connected to a high impedance voltage source at a reference voltage node, and still further includes a voltage-dropping device connected between said reference voltage node and the drain of said memory cell.

2. The integrated circuit of claim 1 wherein said voltage-dropping device is a bipolar transistor having its collector connected to a low impedance voltage source, its base connected to said reference voltage node, and its emitter connected to said drain of said memory cell.

3. The integrated circuit of claim 1 wherein said memory cell further comprises a floating gate overlying said tub and at least partially underlying said control gate.

4. The integrated circuit of claim 1 wherein said memory cell is programmed by applying high voltages to said control gate and said drain, and a low voltage to said tub.

5. The integrated circuit of claim 1 wherein said tub is a p-tub, said cathode and said source and drain regions are n+ regions formed in said tub.

6. The integrated circuit of claim 5 wherein said p-tub is formed in an n-tub that is formed in a p-type substrate.

7. The integrated circuit of claim 6 wherein during programming of said memory cell said p-tub is connected to a source of a negative bias voltage with respect to the voltage applied to said substrate.

8. The integrated circuit of claim 6 wherein the n+ source region and said p-type substrate are connected to a ground voltage source ($V_{ss}$).

9. A method of operating an integrated circuit that includes a memory cell comprising source and drain regions formed in a doped tub, and a control gate overlying said tub;

characterized by providing a voltage from a high impedance voltage source to a reverse-breakdown diode having a first electrode connected to said doped tub, and a second electrode connected to the base of a bipolar transistor having its collector connected to a low impedance voltage source and having its emitter connected to the drain of said memory cell.

10. The method of claim 9 wherein said memory cell further comprises a floating gate overlying said tub and at least partially underlying said control gate.

11. The method of claim 9 wherein said memory cell is programmed by applying high voltages to said control gate and said drain, and a low voltage to said tub.

12. The method of claim 9 wherein said tub is a p-tub, and said cathode, source and drain regions are n+ regions formed in said tub.

13. The method of claim 12 wherein said p-tub is formed in an n-tub that is formed in a p-type substrate.

14. The method of claim 13 wherein during programming of said memory cell said p-tub is connected to a source of a negative bias voltage with respect to the voltage applied to said substrate.

15. The method of claim 13 wherein the n+ source region and said p-type substrate are connected to a ground voltage source ($V_{ss}$).

16. A method of operating an integrated circuit that includes a memory cell comprising a source and a drain formed in a doped tub, and a control gate overlying said tub;

characterized by providing a voltage between said drain and said tub that is a diode voltage drop below the reverse-breakdown voltage of the junction formed by said drain and said tub, wherein said tub is a p-tub, said cathode and said source and drain regions are n+ regions formed in said tub.

17. The method of claim 16 wherein said memory cell further comprises a floating gate overlying said tub and at least partially underlying said control gate.

18. The method of claim 16 wherein said memory cell is programmed by applying high voltages to said control gate and said drain, and a low voltage to said tub.

19. The method of claim 16 wherein said p-tub is formed in an n-tub that is formed in a p-type substrate.

20. The method of claim 19 wherein during programming of said memory cell said p-tub is connected to a source of a negative bias voltage with respect to the voltage applied to said substrate.

21. The method of claim 19 wherein the n+ source region and said p-type substrate are connected to a ground voltage source ($V_{ss}$).

* * * * *